United States Patent
Ikeda

(10) Patent No.: US 8,679,961 B2
(45) Date of Patent: Mar. 25, 2014

(54) METHOD OF MANUFACTURING SEMICONDUCTOR DEVICE HAVING PRE-SILICIDE NITROGEN IMPLANT

(75) Inventor: Keiji Ikeda, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 122 days.

(21) Appl. No.: 13/336,307

(22) Filed: Dec. 23, 2011

(65) Prior Publication Data

US 2012/0164800 A1 Jun. 28, 2012

Related U.S. Application Data

(63) Continuation-in-part of application No. PCT/JP2009/002970, filed on Jun. 26, 2009.

(51) Int. Cl.
*H01L 21/02* (2006.01)
*H01L 21/425* (2006.01)

(52) U.S. Cl.
USPC ............ 438/528; 438/301; 438/769; 257/384

(58) Field of Classification Search
None
See application file for complete search history.

(56) References Cited

U.S. PATENT DOCUMENTS

| | | | |
|---|---|---|---|
| 5,659,194 A | 8/1997 | Iwamatsu et al. | |
| 7,105,429 B2 * | 9/2006 | Jawarani | 438/592 |
| 2002/0048919 A1 * | 4/2002 | Iwamatsu et al. | 438/592 |
| 2002/0061639 A1 | 5/2002 | Itonaga | |
| 2005/0202663 A1 | 9/2005 | Tsuchiaki | |
| 2005/0202664 A1 | 9/2005 | Jawarani | |
| 2007/0246781 A1 * | 10/2007 | Tsuchiaki | 257/369 |

FOREIGN PATENT DOCUMENTS

| | | | | |
|---|---|---|---|---|
| EP | 936664 A2 * | 8/1999 | | H01L 21/60 |
| JP | 7-221297 | 8/1995 | | |
| JP | 2002-184717 | 6/2002 | | |
| JP | 2005-259956 | 9/2005 | | |
| JP | 2006-59843 | 3/2006 | | |
| JP | 2007-19205 | 1/2007 | | |
| JP | 2009-111214 | 5/2009 | | |

OTHER PUBLICATIONS

International Search Report from Japanese Patent Office for PCT/JP2009/002970, mailed Sep. 15, 2009.
Migita, S. et al., "Self-Limiting Growth Behavior of Epitaxial $NiSi_2$ and Its Impact on Controlled Silicidation of Metal Source/Drain in Silicon Nanowire MOSFETs," Extended Abstracts of the 2008 International Conference on Solid State Devices and Materials, Tsukuba, pp. 686-687, (2008).
Notification of Reason(s) for Refusal issued by the Japanese Patent Office on Apr. 9, 2013, for Japanese Patent Application No. 2011-519318, and English-language translation thereof.
Notice of Preliminary Rejection issued by the Korean Intellectual Property Office on May 23, 2013, for Korean Patent Application No. 10-2012-7001715, and English-language translation thereof.
Notification of the First Office Action issued by the State Intellectual Property Office of the People's Republic of China on Dec. 4, 2013, for Chinese Patent Application No. 200980160071.5, and English-language translation thereof.

* cited by examiner

*Primary Examiner* — Andres Munoz
(74) *Attorney, Agent, or Firm* — Finnegan, Henderson, Farabow, Garrett & Dunner, L.L.P.

(57) ABSTRACT

According to one embodiment, a method of manufacturing a semiconductor device which includes a MISFET, includes: forming a gate insulating film on a semiconductor substrate; forming a gate electrode on the gate insulating film; implanting nitrogen equal to or more than 5.0e14 atoms/$cm^2$ and equal to or less than 1.5e15 atoms/$cm^2$ in the semiconductor substrate by tilted ion implantation in a direction from an outside to an inside with respect to side surfaces of the gate electrode; depositing a metal film including nickel on areas in which nitrogen atoms are implanted, the areas are in a semiconductor substrate on both sides of the gate electrode; and performing first heat processing of reacting the metal film and the semiconductor substrate and forming metal semiconductor compound layers, the shapes of the layers are controlled by the nitrogen profiles of the areas.

13 Claims, 10 Drawing Sheets

POINT 1: NiSi

POINT 2: NiSi

POINT 3: NiSi

SILICIDE SIDE | SILICON SIDE

SILICIDE SIDE | SILICON SIDE

← SILICIDE SIDE | SILICON SIDE →

← SILICIDE SIDE | SILICON SIDE →

POINT 1 : $NiSi_2$

US 8,679,961 B2

METHOD OF MANUFACTURING SEMICONDUCTOR DEVICE HAVING PRE-SILICIDE NITROGEN IMPLANT

CROSS-REFERENCE TO RELATED APPLICATION

This application is continuation-in-part (CIP) application based upon the International Application PCT/JP2009/002970, the International Filing Date of which is Jun. 26, 2009, the entire content of which is incorporated herein by reference.

FIELD

Embodiments described herein relate generally to method of manufacturing semiconductor device.

BACKGROUND

In a metal S/D (Source/Drain) MISFET (Metal Insulator Semiconductor Field Effect Transistor) which has been reported, the source/drain, and its extension portion are formed of a metal semiconductor compound such as silicide. However, an overlap length of the extension portions and gate electrode which determines a current drivability and a short channel effect of the metal S/D MISFET are not positively controlled in spite of their importance. Particularly, this control is very important in case of a scaled down MISFET having a gate length equal to or less than 30 nm.

In case of a metal S/D MISFET in which the extension portion is formed with a silicide layer, the film thickness and horizontal direction growth of the silicide layer at the gate edge needs to be accurately controlled to control the overlap length.

Meanwhile, when a nickel silicide layer is taken as an example, to control the film thickness of the nickel silicide layer, an initially deposited nickel film thickness and the temperature and time of heat processing upon formation of nickel silicide are controlled. However, it is difficult to sufficiently control diffusion of nickel due to influences such as variation of the deposition amount of the nickel film and variation of the temperature upon reaction.

Particularly, in case the volume of silicon to be converted into silicide is relatively less than metal to be reacted like a 3-dimensional structure device including a MISFET on an ultrathin SOI (Silicon On Insulator), MISFET having a narrow gate width, FinFET or Nano-wire MISFET, conversion of a narrow portion of silicon into nickel silicide is accelerated, and the narrow portion is abnormally grown. When this abnormal growth occurs, conversion into silicide in a channel direction is accelerated, and therefore it becomes more difficult to control the overlap length.

Further, with a device which uses a SOI substrate, the abnormal growth and agglomeration of silicide due to the heat gradient caused by a small thermal conductivity of a BOX (Buried OXide) layer locally occur, and therefore it becomes still more difficult to control the gate overlap length.

DETAILED DESCRIPTION

Figure 1A:
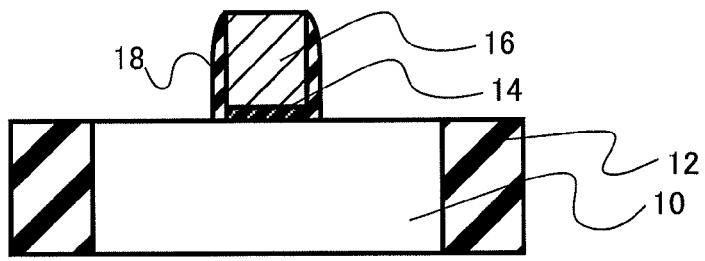
FIG. 1A to FIG. 1E are process sectional views illustrating a manufacturing method according to a first embodiment.

The method of manufacturing a semiconductor device according to an aspect of the present invention is a method of manufacturing a semiconductor device which has a MISFET, and includes the steps of: forming a gate insulating film on a semiconductor substrate; forming a gate electrode on the gate insulating film; implanting nitrogen atoms equal to or more than $5.0e14$ atoms/cm$^2$ and equal to or less than $1.5e15$ atoms/cm$^2$ in the semiconductor substrate by tilted ion implantation in a direction from an outside to an inside with respect to side surfaces of the gate electrode; depositing a metal film including nickel on areas in which nitrogen atoms are implanted, the areas are in a semiconductor substrate on both sides of the gate electrode; and performing first heat processing of reacting the metal film and the semiconductor substrate and forming a metal semiconductor compound layer.

Hereinafter, embodiments will be described using the accompanying drawings. In the present description, a semiconductor substrate refers to an uppermost semiconductor area in which a MISFET is formed in a substrate such as a wafer used to manufacture a MISFET. In case of, for example, a SOI substrate, the semiconductor substrate refers to a SOI layer. Further, a metal S/D (Source/Drain) MISFET means MISFET in which junction between source/drain and semiconductor substrate is Schottky junction.

The inventors found that, when ions (or atoms) of N (nitrogen) are implanted by tilted ion implantation in a semiconductor substrate from side surfaces of a gate electrode, it is possible to stably control the film thickness and horizontal direction growth of a metal semiconductor compound layer which becomes a source/drain extension. Further, they found that, under the above adequate condition, the side surface (or side end) shape of the source/drain extension can be formed in a planar shape having a tilt in a direction apart from a channel area toward the depth direction from the semiconductor substrate surface. Hereinafter, embodiments will be described using the accompanying drawings.

(First Embodiment)

The method of manufacturing a semiconductor device according to the present embodiment is a method of manufacturing a semiconductor device which has a MISFET, and includes: forming a gate insulating film on a semiconductor substrate; forming a gate electrode on the gate insulating film; implanting nitrogen equal to or more than $5.0e14$ atoms/cm$^2$ and equal to or less than $1.5e15$ atoms/cm$^2$ in the semiconductor substrate by tilted ion implantation in a direction from an outside to an inside with respect to side surfaces of the gate electrode; depositing a metal film including nickel, on the semiconductor substrate on both sides of the gate electrode; and performing first heat processing of reacting the metal film and the semiconductor substrate and forming a metal semiconductor compound layer which is a source/drain extension.

Further, the MISFET according to the present embodiment is a metal S/D MISFET and planar Bulk MISFET.

FIG. 1 is a process sectional view illustrating the manufacturing method according to the present embodiment. FIG. 1 is a sectional view vertical to a gate width direction of the MISFET.

First, as illustrated in FIG. 1A, an device isolation layer 12 is formed on a bulk silicon substrate (hereinafter, simply referred to as "silicon substrate") 10 using STI (Shallow Trench Isolation) according to a conventional method. Subsequently, a gate insulating film 14 is formed on a silicon substrate 10. For the gate insulating film 14, a film such as $SiO_2$, SiON, $HfO_2$, $Al_2O_3$, $HfAl_xO_y$, HfLaO, and $La_xOy$ or a stacked film which combines any of these can be applied.

Next, a gate electrode 16 is formed on the gate insulating film 14. The gate electrode 16 is formed with, for example, polysilicon, metal or a stacked structure of polysilicon and metal or metals. For the metals, for example, TiN, TaN, NiSi, $NiSi_2$, Mo and W are applicable. Further, the gate electrode is by no means limited to a gate electrode formed by a RIE (Reactive Ion Etching) method, and the gate electrode may be made of, for example, TiN, Al and W by, for example, a damascene method. Meanwhile, a case will be described as an example where an electrode in which an upper portion of polysilicon is converted into silicide is adopted as a gate electrode. The gate length is, for example, 20 nm and preferably 5 nm or more and 30 nm or less.

Next, on both side surfaces of the gate electrode 14, gate sidewalls 18 are formed by deposition of films according to, for example, a CVD (Chemical Vapor Deposition) method and etching according to the RIE method. The gate sidewalls 18 are formed with, for example, a silicon oxide film, a silicon nitride film or layered film of these films. The film thickness of the gate sidewalls 18 is, for example, 5 nm and preferably 2 nm or more and 12 nm or less.

After the gate sidewalls 18 are formed, halo ion implantation may be performed to improve the short channel effect immunity. In case of a nMISFET, impurities such B, $BF_2$ or In are implanted by tilted ion implantation. In case of a pMISFET, impurities such P, As or Sb are implanted by tilted ion implantation. The dose amount of impurities upon ion implantation is in the range of, for example, 1.0e12 atoms/$cm^2$ or more and 5.0e14 atoms/$cm^2$ or less.

Figure 1B:
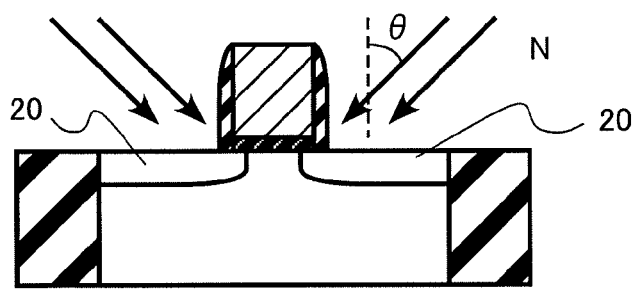

Next, as illustrated in FIG. 1B, the dose amount of nitrogen (N) atoms (or ions) equal to or more than 5.0e14 atoms/$cm^2$ and equal to or less than 1.5e15 atoms/$cm^2$ is implanted in the silicon substrate 10 by tilted ion implantation. Tilted ion implantation is performed by tilting an ion beam in a direction from an outside to an inside with respect to the side surfaces of the gate electrode 16, that is, two left and right side surfaces in FIG. 1. Hereinafter, as illustrated in FIG. 1B, the tilting angle of ion implantation with respect to the gate electrode side surfaces is a tilting angle θ. According to this tilted ion implantation, a high concentration nitrogen layer 20 which controls formation of a metal semiconductor compound layer which subsequently becomes a source/drain extension is formed in the silicon substrate 10 on the both sides of the gate electrode 16.

Meanwhile, for example, the gate electrode is formed on a wafer surface such that the gate electrode has a gate length in a direction orthogonal and parallel to a notch direction of a wafer. Ion implantation is performed by, for example, dividing the dose amount in the above range into four of rotation angles of 23° (degree), 113°, 203° and 293° at the tilting angle of 45° (degree). In addition, the tilt angle refers to a tilting angle of ion implantation with respect to a normal vector of the wafer surface, and the rotation angle refers to a rotation angle of ion implantation with a notch direction at 0° (degree). Further, for example, the dose amount in the above range may be implanted by rotation ion implantation at the tilting angle of 45°.

Further, the tilt angle and acceleration energy only need to be set to adequate values taking into account a required silicide film thickness and overlap length in terms of design of a MISFET. When, for example, the target silicide film thickness is 30 nm, Rp (Projected Range) of ion implantation may be 10 kev and the tilt angle may be 30° at which the silicide film thickness is 27 nm that is substantially equal to target thickness. Further, when, for example, the target silicide film thickness is 15 nm, Rp (Projected Range) of ion implantation may be 5 kev and the tilt angle may be 30° at which the silicide film thickness the silicide film thickness is 15 nm.

Meanwhile, the tilting angle θ is uniquely determined based on a geometric arrangement of the gate electrode, tilt angle and rotation angle. The tilting angle θ is preferably 15° (degree) or more and 75° (degree) or less and is more preferably 30° or more and 60° or less in view of controlling diffusion in the horizontal direction and improving the short channel effect immunity.

Figure 1C:
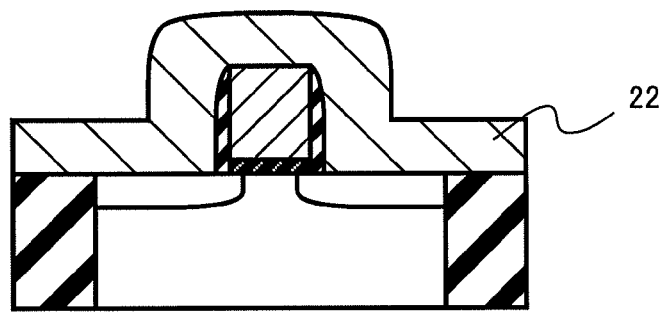

Next, as illustrated in FIG. 1C, for example, a nickel film 22 is deposited as a metal film including nickel (Ni) on the silicon substrate on both sides of the gate electrode 16 according to, for example, a spattering method. The nickel film is deposited on areas in which nitrogen atoms are implanted. The film thickness of the nickel film 22 is, for example, 30 nm.

Figure 1D:
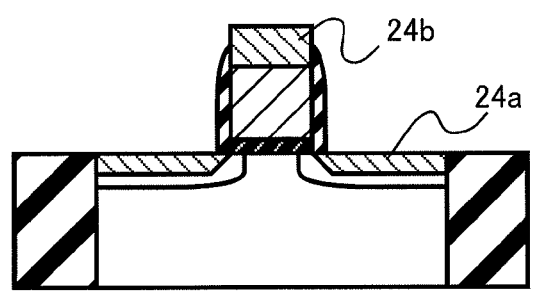

Next, RTA (Rapid Thermal Annealing) is performed as first heat processing at, for example, 325° C. for one minute in a non-oxidizing atmosphere such as a nitrogen atmosphere or argon atmosphere. Then, as illustrated in FIG. 1D, the unreacted nickel film 22 is removed by common chemical processing. Further, second heat processing is then performed at a temperature higher than the temperature of the first heat processing. RTA (Rapid Thermal Annealing) is performed as the second heat processing at, for example, 450° C. for one minute in a non-oxidizing atmosphere such as a nitrogen atmosphere or argon atmosphere.

By these heat processing, the nickel film 22 and silicon substrate 10 where nitrogen atoms are implanted are reacted to form the nickel silicide layer 24a which becomes a source/drain extension. In this case, the gate electrode 16 of polysilicon and nickel film 22 are also reacted, and the nickel silicide layer 24b is also formed on the gate electrode 16.

By the first heat processing, the nickel film 22 and silicon substrate 10 are reacted to form the nickel silicide layer 24a. By the second heat processing, the phase of the formed nickel silicide layer 24a is transitioned from, for example, $Ni_2Si$ phase to NiSi phase to make a lower resistivity phase.

The temperature of the first heat processing is preferably 275° C. or more and 350° C. or less. When the temperature is less than 275° C., the nickel film 22 and silicon substrate 10 are not sufficiently reacted, and therefore the final sheet resistivity of the nickel silicide layer 24a cannot be sufficiently made lower. Further, when the temperature exceeds 350° C., there is a concern that the high concentration nitrogen layer 20 unstably controls a silicide growth.

The temperature of the second heat processing is by no means limited in particular as long as it is higher than the temperature of the first heat processing, and is preferably 400° C. or more and 450° C. or less.

The nickel silicide layer 24a becomes a source/drain extension. Subsequently, as will be described below, the existence of the high concentration nitrogen layer 20 adequately controls the film thickness and horizontal direction growth of the nickel silicide layer 24b. That is, the existence of the high concentration nitrogen layer 20 makes the growth of nickel silicide self-limiting, suppresses an abnormal growth of nickel silicide and makes the film thickness and horizontal direction growth uniform. Further, the existence of the high concentration nitrogen layer 20 can form the side surface shape of the nickel silicide layer 24a into a planar shape having a tilt in a direction moving away from a channel area from the surface of the silicon substrate 10 toward the depth direction. That is, as illustrated in FIG. 1D, seen from the cross section, a junction portion of the channel area and nickel silicide layer 24a has a linear tilted shape. This shape is assumed to be formed by reflecting a nitrogen concentration profile of the high concentration nitrogen layer formed by implanting ions of nitrogen by tilted ion implantation, or crystal information of the nickel silicide layer 24a. Thus the shapes of the nickel silicide layers 24a are controlled by the nitrogen profiles of the areas where nitrogen atoms are implanted.

Figure 1E:
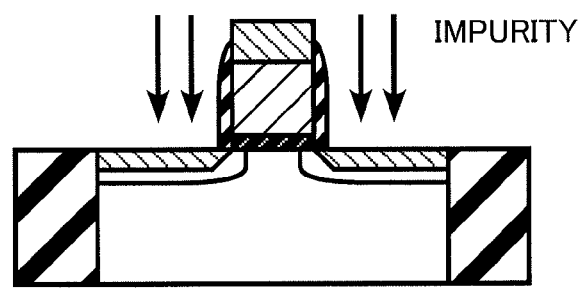

Next, as illustrated in FIG. 1E, the source/drain impurity ions are implanted across the formed nickel silicide layer 24a. This ion implantation is performed to make a Schottky junction resistance of the silicon substrate 10 and nickel silicide 24a lower. In case of a nMISFET, for example, P or As is implanted as impurities. In case of a pMISFET, for example, B or $BF_2$ is implanted as impurities. The dose amount of impurities is in the range of, for example, 1.0e15 atoms/$cm^2$ or more and 1.0e16 atoms/$cm^2$ or less.

Then, activation anneal is performed at the temperature of about 600° C., and impurities are diffused in silicide and activated in the silicide/silicon interface. For the purpose of controlling a Schottky barrier height of Schottky junction formed in the silicide/silicon interface upon this source/drain impurity implantation, elements such as S, Yb and Al which have an effect of modulating the Schottky barrier height may be co-implanted.

With the MISFET of the semiconductor device manufactured by the above method, the high concentration nitrogen layer makes the growth of silicide of the source/drain extension self-limiting. Further, the abnormal growth is suppressed simultaneously. By this means, it is possible to substantially suppress variation of the overlap amount Lov of the source/drain extension to the gate electrode edge portion with respect to a design value, and variation in the gate width direction. The variation of Lov causes the variation of the channel length, and therefore directly becomes the variation of the threshold voltage of MISFETs. Consequently, this manufacturing method can substantially reduce the variation of the threshold voltage of the MISFETs.

Further, the junction portion of the channel area and nickel silicide layer 24a has a linear tilted shape, so that the distance between the source extension and drain extension in the depth portion of the channel area can be secured substantially longer than a conventional distance. Consequently, punch through at the channel depth portion is suppressed and the immunity to short channel effect is further improved.

Further, the high concentration nitrogen layer makes the growth of silicide self-limiting in the film thickness direction and suppresses the abnormal growth. Consequently, the sheet resistance of the source/drain extension becomes stable and junction leakage is reduced.

Figure 2A:
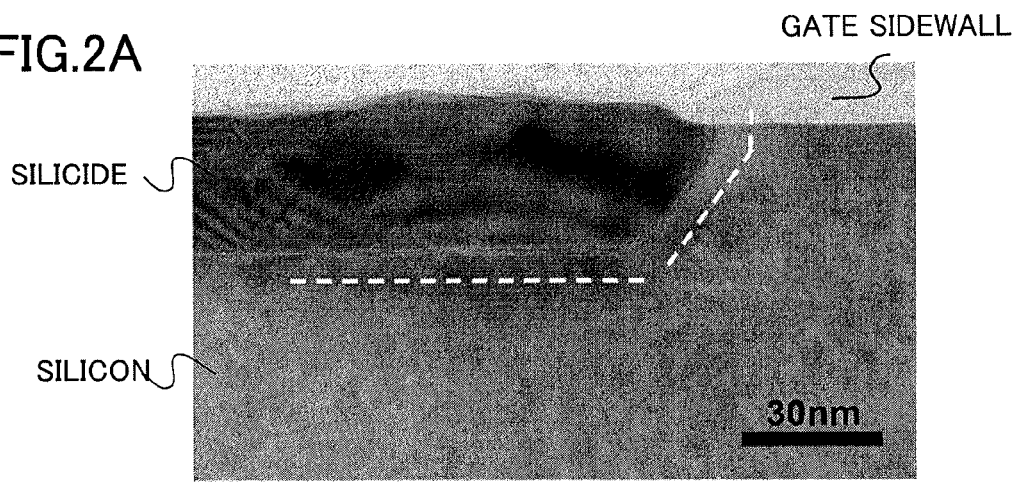
FIG. 2A and FIG. 2B are a sectional TEM images of a source/drain extension.
Figure 2B:
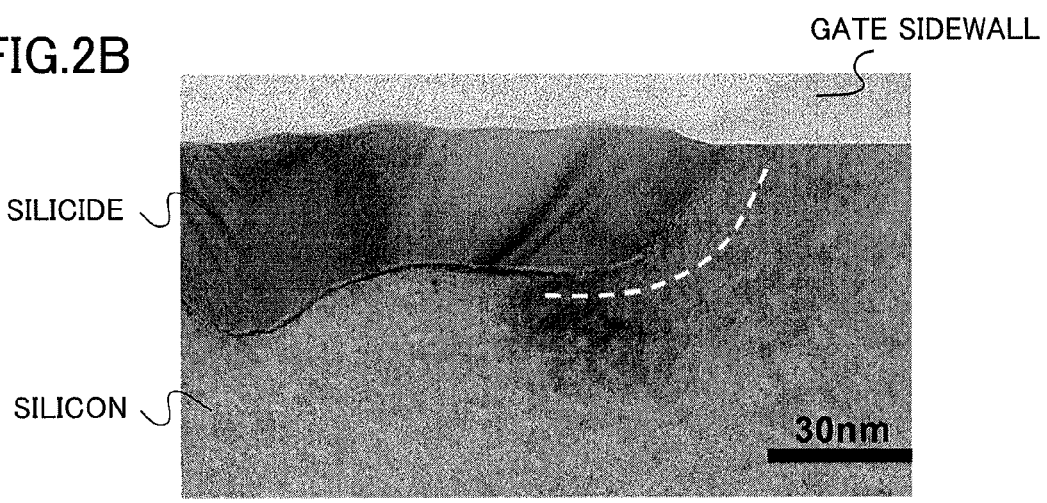

Next, the function and effect of the present embodiment will be described based on, for example, an experiment result. FIGS. 2A and 2B are cross sectional TEM images of the source/drain extension. FIG. 2A illustrates a case in which tilted ion implantation of nitrogen is performed, and FIG. 2B illustrates a case in which tilted ion implantation of nitrogen is not performed.

The manufacturing conditions of a target object illustrated in FIGS. 2A and 2B are as follows.

Semiconductor substrate: (100) Silicon
Tilted ion implantation of nitrogen: the dose amount of 1.0e15 atoms/$cm^2$, 10 keV, tilt angle 45° and division into four rotation angles 23°, 113°, 203° and 293°.
Nickel film: Film thickness 30 nm and spattering method.
First heat processing: RTA, 325° C. and 1 minute
Second heat processing: RTA, 450° C. and 1 minute FIG. 2 illustrates that, by implanting ions of nitrogen by tilted ion implantation, diffusion of nickel in silicon is controlled, the abnormal growth in the nickel silicide layer bottom surface is suppressed and the nickel silicide layer having a uniform film thickness is formed. Further, the horizontal direction growth of the nickel silicide layer is controlled, and, particularly, a facet surface (plain) tilted at a nearly constant angle obliquely downward from the silicon substrate surface is formed at a junction portion with the channel area of the nickel silicide layer.

Figure 3:
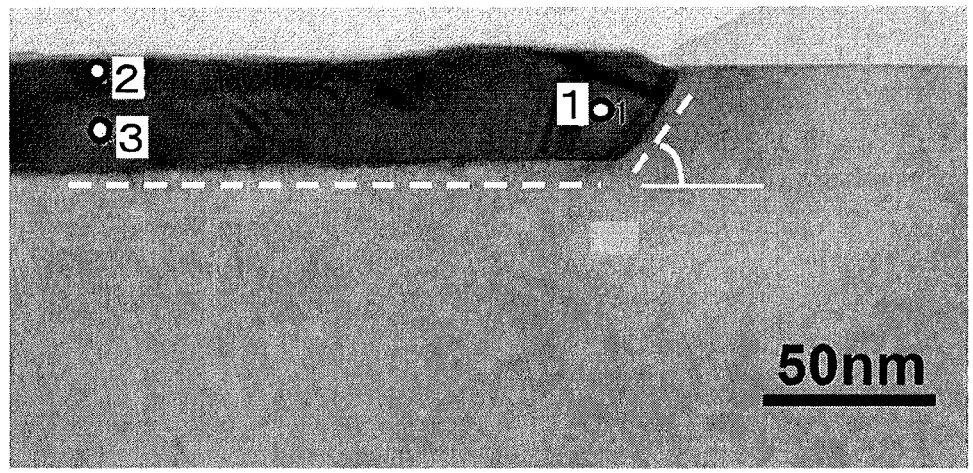
FIG. 3 is a view illustrating a transmission electron beam diffraction observation result of a silicide layer of FIG. 2A.
Figure 3:
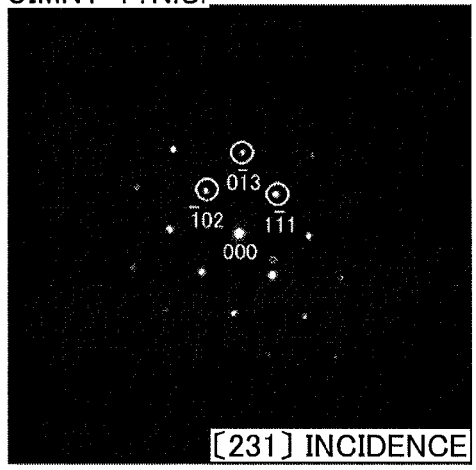
Figure 3:
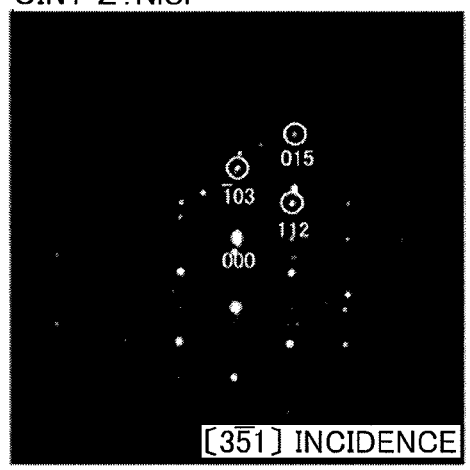
Figure 3:
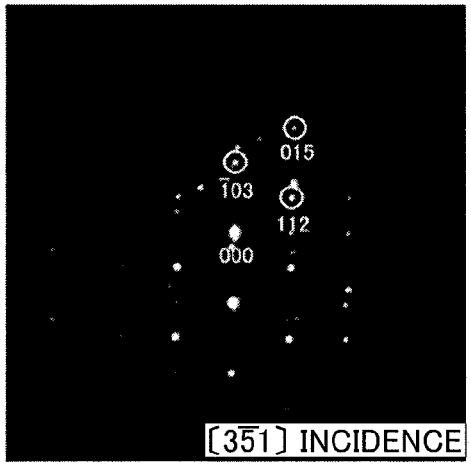

FIG. 3 is a view illustrating a transmission electron beam diffraction observation result of a silicide layer of FIG. 2A. It has been confirmed based on the analysis result of the transmission electron beam diffraction image that the formed silicide has NiSi (nickel monosilicide) phases at a point 1, point 2 and point 3, respectively. Thus, the silicide layer formed by the above manufacturing method is formed with the NiSi phases having a lower resistivity than the $NiSi_2$ phase. It has been confirmed that the NiSi phase and silicon of the channel area do not have a lattice-match.

Figure 4A:
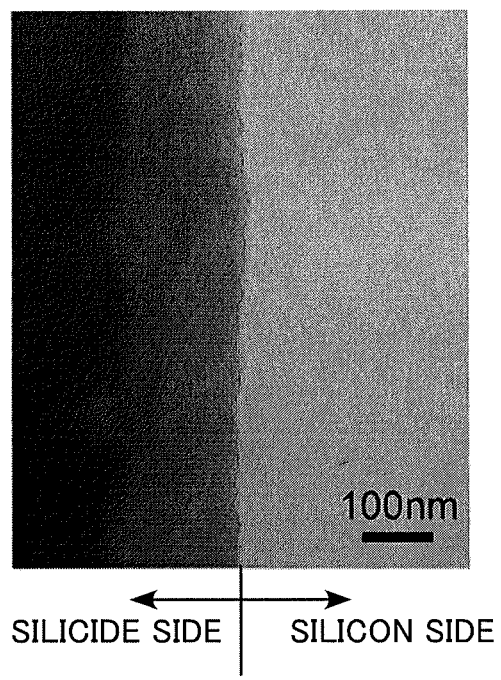
FIG. 4A and FIG. 4B are planar TEM images of a silicide/silicon interface.
Figure 4B:
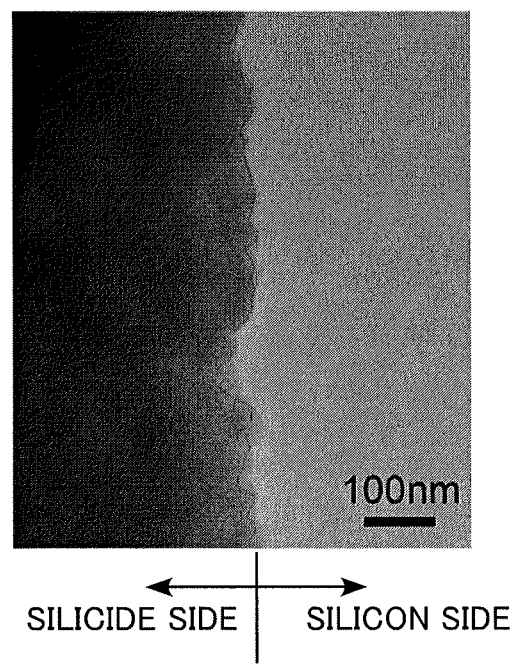

FIG. 4 is a planar TEM image of the silicide/silicon interface of the source/drain extension. FIG. 4A illustrates a case in which tilted ion implantation of nitrogen is performed, and FIG. 4B illustrates a case in which tilted ion implantation of nitrogen is not performed. The manufacturing conditions of the target object are the same as in FIG. 2. Further, the insulating film and silicide layer on the surface are peeled off by HF processing to observe the interface shape.

As is obvious from FIG. 4, roughness of the silicide/silicon interface is substantially improved by implanted ions of nitrogen by tilted ion implantation. While σ (sigma) of edge roughness in case which nitrogen ion implantation in FIG. 4B is not performed is 14.5 nm, and σ in case which nitrogen ion implantation in FIG. 4A is performed is improved to 5.5 nm.

Figure 5A:
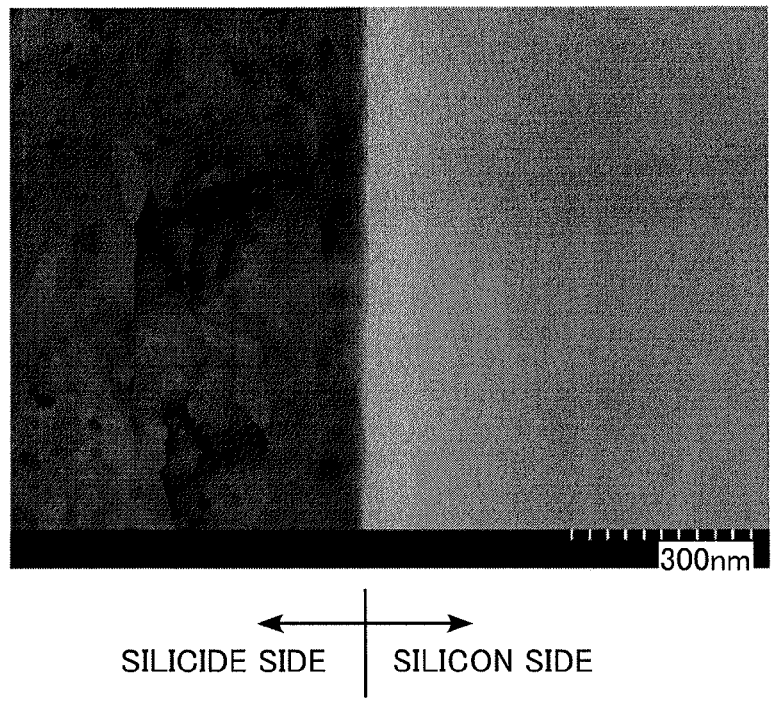
FIG. 5A and FIG. 5B are planar TEM images of a silicide/silicon interface.
Figure 5B:
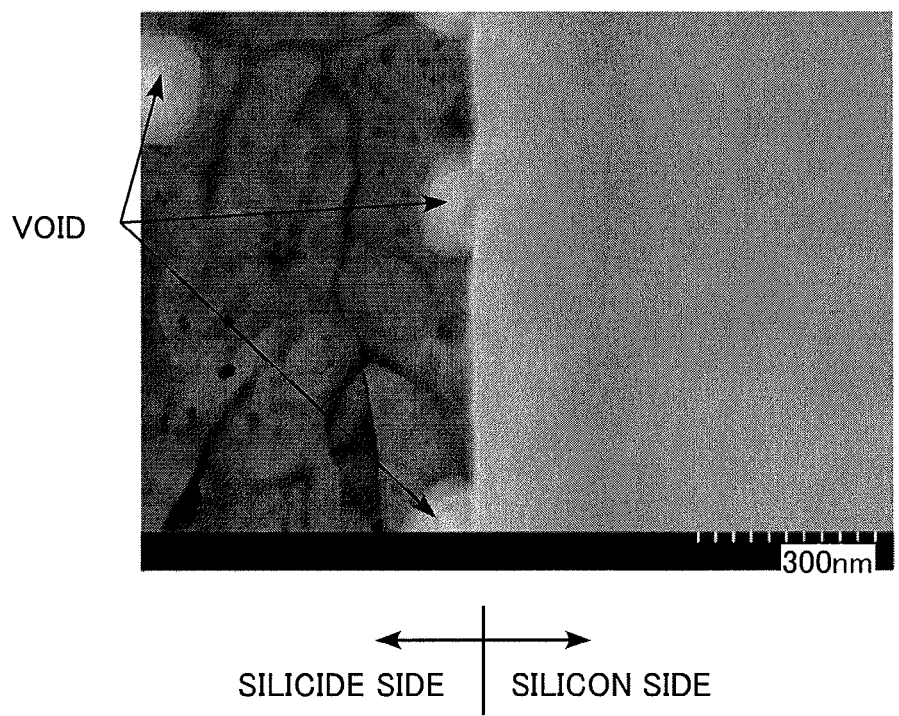

FIG. 5 is a planar TEM image of the silicide/silicon interface of a source/drain extension. FIG. 5A illustrates a case in which tilted ion implantation of nitrogen is performed, and FIG. 5B illustrates a case in which tilted ion implantation of nitrogen is not performed. The manufacturing conditions of the target object are the same as in FIGS. 2 and 4. In addition, HF processing as in FIG. 4 is not performed.

In case where nitrogen ion implantation is not performed (FIG. 5B), a grain size of nickel silicide is large, and a void is formed. In contrast with this, in case where nitrogen implantation is performed (FIG. 5A), the grain size of nickel silicide becomes small, and formation of a void is suppressed. By this means, it is possible to form a silicide layer in which a void is not formed or condensation does not occur due to nitrogen ion implantation.

Figure 6:
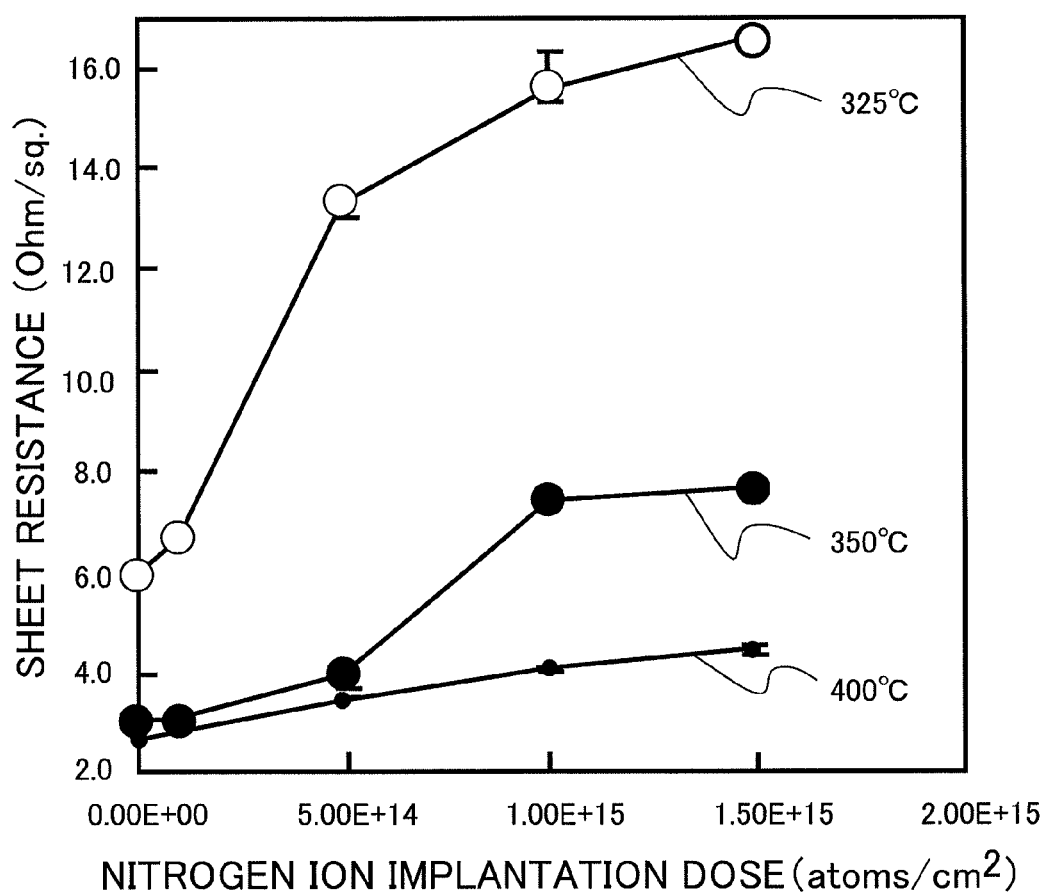
FIG. 6 is a view illustrating the relationship between a nitrogen ion implantation dose amount and a sheet resistance of a silicide layer.

FIG. 6 is a view illustrating the relationship between the nitrogen ion implantation dose amount and the sheet resistance of the silicide layer. The manufacturing conditions of the target object are the same as in FIGS. 2, 4 and 5 except that the dose amount of nitrogen ion implantation is changed, division is performed at the tilt angle of 7°, and the temperature of the first heat processing is changed at 325° C., 350° C. and 400° C.

Meanwhile, the sheet resistance value is inversely proportional to a film thickness of the formed silicide layer. It has been found that nitrogen atoms provide an effect of blocking diffusion of nickel atoms in silicon, so that the film thickness of the nickel silicide layer to be formed decreases following an increase of the dose amount of nitrogen ion implantation.

FIG. 6 illustrates that an adequate nitrogen concentration profile is formed by nitrogen ion implantation, so that it is possible to make the growth of nickel silicide to be formed self-limiting, and control the film thickness and horizontal direction growth amount.

When the temperature of the first heat processing is 400° C., the dependency of the sheet resistance value on the nitrogen implantation amount is small. This suggests that the diffusion speed of nickel in silicon at 400° C. is fast, and the diffusion suppression effect resulting from nitrogen is small at this temperature. Hence, the temperature of the first heat processing is preferably 275° C. or more and 350° C. or less.

Further, when the nitrogen ion dose amount is less than 5.0e14 atoms/cm$^2$, a distinct resistance suppression effect is not provided compared to cases where nitrogen ion implantation is not performed, and the diffusion suppression effect resulting from the dose amount of nitrogen in this range is small. Consequently, the nitrogen ion dose amount may be equal to or more than 5.0e14 atoms/cm$^2$. Further, the nitrogen ion dose amount is preferably equal to or more than 1.0e15 atoms/cm$^2$.

Figure 7:
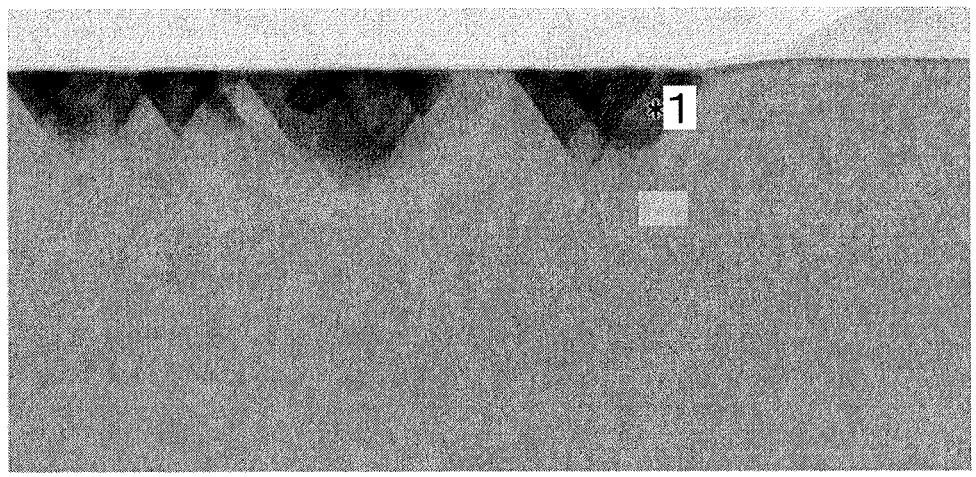
FIG. 7 is a view illustrating a sectional TEM image of a silicide layer and a transmissive electron beam diffraction observation result.
Figure 7:
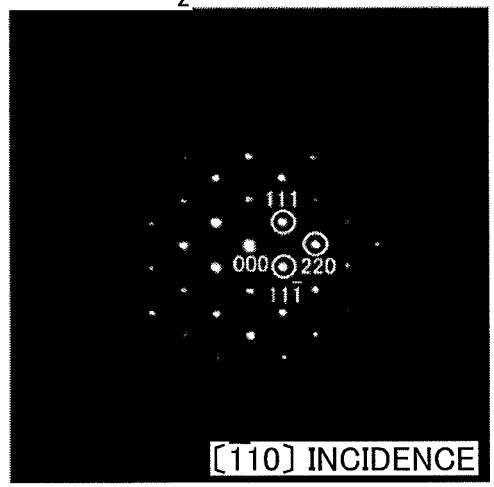

FIG. 7 is a view illustrating a cross sectional TEM image of a silicide layer and a transmission electron beam diffraction observation result. The manufacturing conditions of the target object are the same as in FIG. 6. However, the nitrogen ion dose amount is 2.0e15 atoms/cm$^2$, and the temperature of the first heat processing is 325° C. In FIG. 7, with this dose amount, nitrogen becomes excessive, and the effect of blocking diffusion of nickel atoms is great and therefore a uniform nickel silicide film is not formed.

In view of the above result, the nitrogen ion dose amount may be 5.0e14 atoms/cm$^2$ or more and 1.5e15 atoms/cm$^2$ or less, and is preferably 1.0e15 atoms/cm$^2$ or more and 1.5e15 atoms/cm$^2$ or less.

(Modified Example of the First Embodiment)

The present modified example is the same as the first embodiment except for implanting ions before formation of the silicide layer instead of implanting ions of source/drain impurities after formation of the silicide in the first embodiment. According to the type or process conditions of a semiconductor substrate or semiconductor compound and design of a MISFET, an optimal timing to implant ions of source/drain impurities only needs to be adequately selected. Further, it is also possible to select not to implant source/drain impurities.

(Second Embodiment)

The method of manufacturing a semiconductor device according to the present embodiment is the same as the first embodiment and its modified example except that a MISFET is a SOI (Silicon On Insulator) MISFET. Therefore, the contents overlapping with the first embodiment and its modified example will not be repeated.

FIG. 8 is a process sectional view illustrating the manufacturing method according to the present embodiment.

Figure 8A:
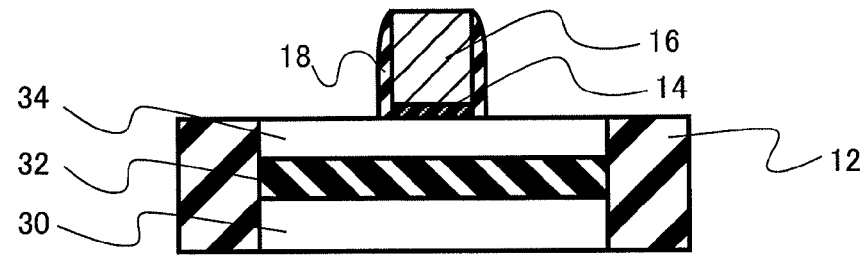
FIG. 8A to FIG. 8E are process sectional views illustrating a manufacturing method according to a second embodiment.
Figure 8B:
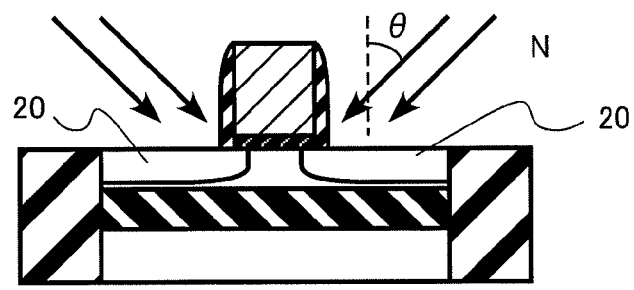
Figure 8C:
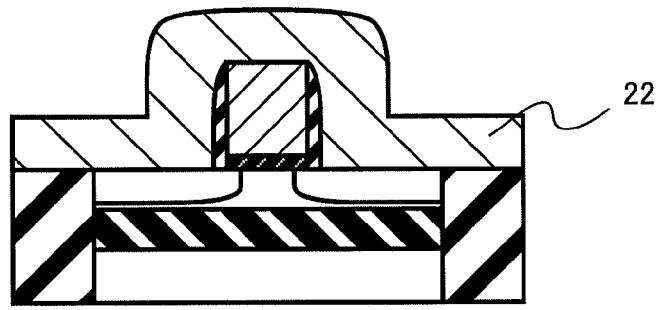
Figure 8D:
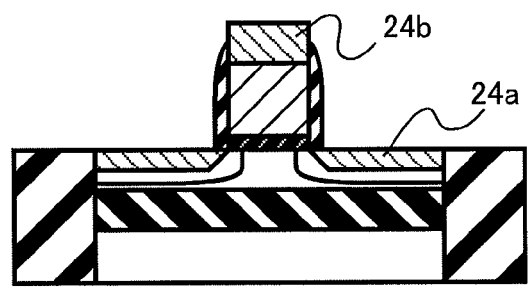
Figure 8E:
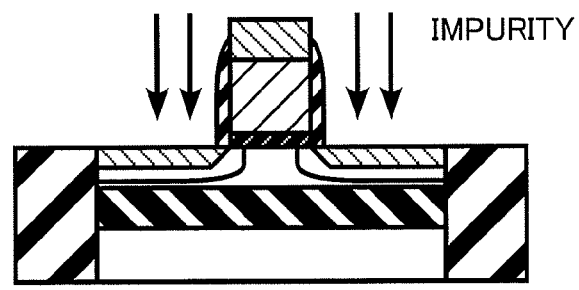

Unlike the first embodiment, as illustrated in FIG. 8A, a MISFET is formed on a so-called SOI substrate on which a SOI layer 34 is formed across a BOX layer 32 on, for example, a support substrate 30 of silicon. Meanwhile, the film thickness of the SOI layer is, for example, an ultrathin film in the range of, for example, 5 nm or more and 50 nm or less.

First, according to a conventional method, an device isolation layer 12 is formed on the SOI layer 34 using STI (Shallow Trench Isolation). Subsequently, the gate insulating film 14 is formed on the SOI layer 34.

The subsequent manufacturing method is basically the same as the first embodiment. In addition, conditions such as acceleration energy of tilted ion implantation of nitrogen are preferably set such that, upon ion implantation in FIG. 8B, the lower surface of a silicide surface 24a formed in FIG. 8D does not reach the upper surface of the BOX layer 32.

When the MISFET is formed on the thin film SOI substrate, the silicide layer of a source/drain extension may be converted into silicide up to the upper surface of the BOX layer 32 and therefore there occurs a problem that a parasitic resistance increases. When the silicide layer of the source/drain extension is converted into silicide up to the upper surface of the BOX layer 32, a junction area of the silicide/silicon interface of the drain area decreases. Therefore, the resistance increases at the junction portion, and the parasitic resistance at the drain increases.

The method of manufacturing a semiconductor device according to the present embodiment can control a depth direction position of a bottom surface of a silicide layer and to prevent the silicide layer from contacting the upper surface of the BOX layer by providing the nitrogen high concentration layer before silicidation. Consequently, it is possible to easily realize a semiconductor device which has a SOI MISFET which provides a reduced parasitic resistance and a higher current drive.

Further, similar to the first embodiment, it is possible to realize a SOI MISFET of a stable threshold voltage and lower junction leakage. As described above, the MISFET on the ultrathin SOI in particular has a problem that conversion of a narrow portion of silicon into nickel silicide is accelerated and the narrow portion is abnormally grown. However, according to the present embodiment, it is possible to prevent silicide from extending to a channel portion due to the abnormal growth by controlling silicidation. Consequently, it is possible to control an overlap length Lov.

Further, similar to the first embodiment, the manufacturing method of implanting ions before formation of a silicide layer may be adopted instead of implanting ions of source/drain impurities after formation of a silicide layer.

(Third Embodiment)

A method of manufacturing a semiconductor device according to the present embodiment is the same as the second embodiment except that a MISFET is a FinFET. Therefore, the contents overlapping with the second embodiment and its modified example will not be repeated. In addition, a FinFET refers to a MISFET in which a gate electrode is provided to sandwich a flat (Fin shape) semiconductor substrate from both side surfaces. A electrostatic integrity of the gate improves, so that it is easy to realize a scaled MISFET having a short gate length.

FIGS. 9A to 9E are process sectional views illustrating the manufacturing method according to the present embodiment. Further, in FIGS. 9A to 9E, the left views are sectional views parallel to a channel length direction of a FinFET. Further, the right views are sectional views of the left views taken along the line A-A.

Figure 9A:
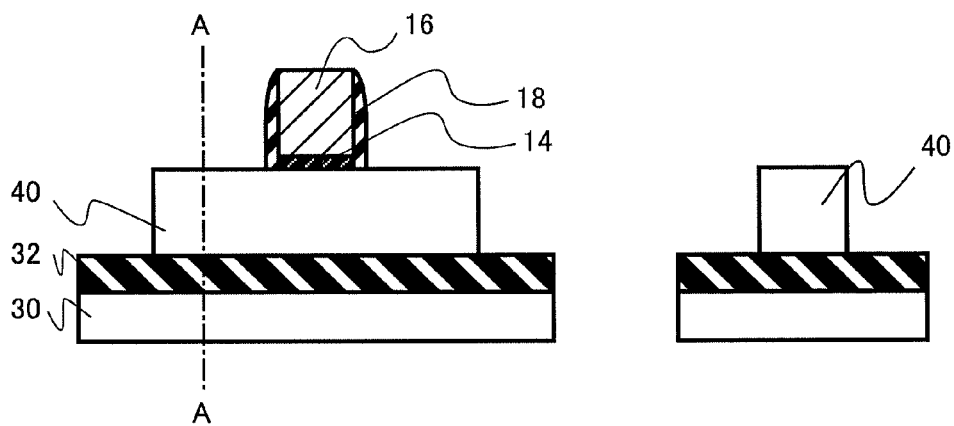
FIG. 9A to FIG. 9E are process sectional views illustrating a manufacturing method according to a third embodiment.

Unlike the second embodiment, a hard mask layer of, for example, a nitride film or oxide film is formed on the SOI layer on the BOX layer 32. Then, a Fin pattern is transferred to a hard mask layer according to a conventional lithography technique and RIE. By etching the SOI layer up to the upper surface of the BOX layer 32 using as a mask the pattern of the formed hard mask layer, a Fin structure 40 of silicon is formed as illustrated in FIG. 9A.

Then, the gate insulating film 14 and gate electrode 16 are formed on the Fin structure 40. Although not illustrated, the gate insulating film 14 and gate electrode 16 are also formed on both side surfaces of the Fin structure 40.

Figure 9B:
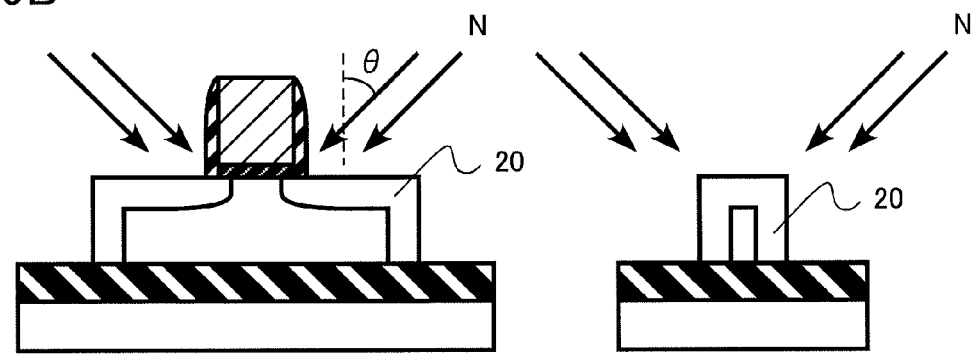
Figure 9C:
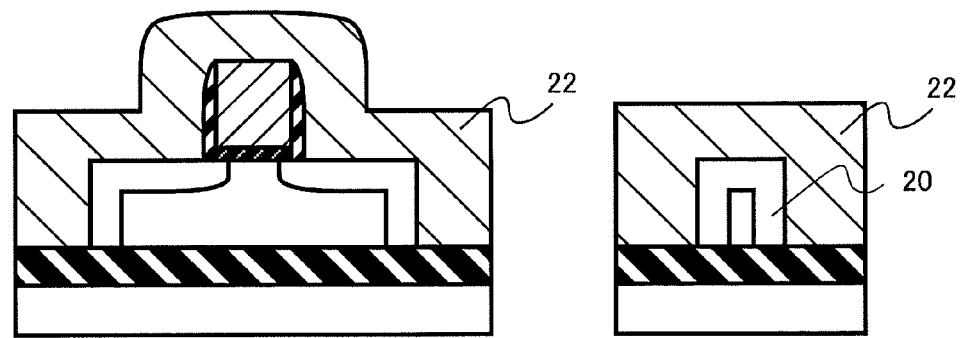

Then, the manufacturing method is basically the same as the second embodiment. In addition, ion implantation conditions are required that, when ions are implanted as illustrated in FIG. 9B, nitrogen is also sufficiently implanted in the source/drain area in both side surfaces of the Fin structure 40 of the source/drain area, and a high concentration nitrogen layer 20 can be formed. Further, conditions are required that ions are implanted to the gate electrode formed on both side surfaces of the Fin structure 40 at a predetermined tilting angle in a direction from an outside to an inside with respect to the side surfaces of the gate electrode.

Generally, the FinFET has a problem that the Fin structure 40 of the source/drain area is completely converted into silicide, and therefore the parasitic resistance increases. When the Fin structure 40 in the source/drain area is completely converted into silicide, the junction area of the silicide/silicon interface of the drain area decreases, and therefore the resistance at the junction portion increases. Therefore, the parasitic resistance at the drain corner increases.

Figure 9D:
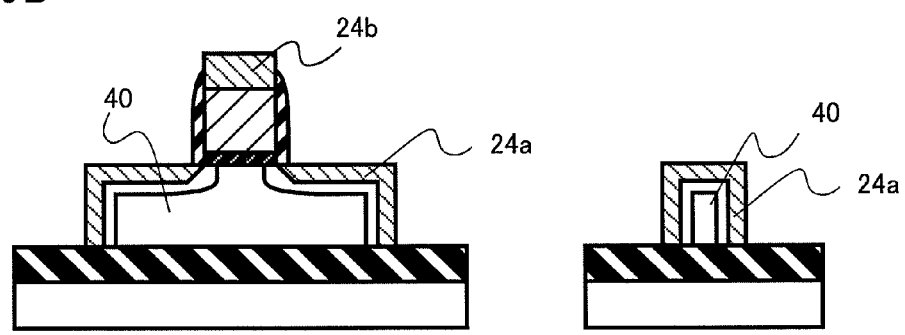
Figure 9E:
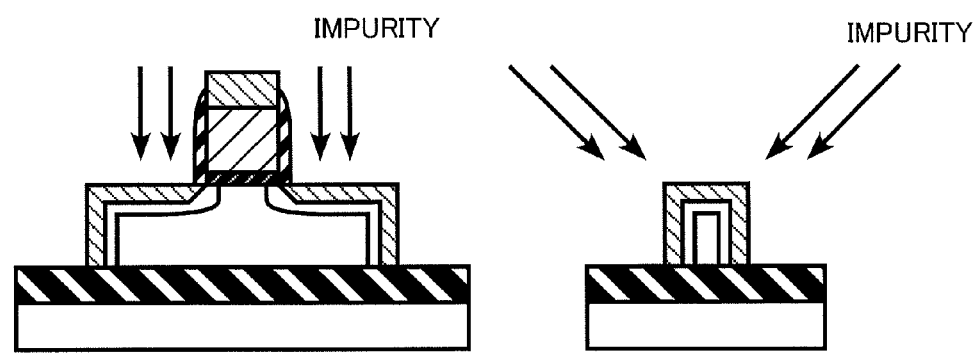

The method of manufacturing a semiconductor device according to the present embodiment can prevent the Fin structure 40 of the source/drain area from being completely converted into silicide as illustrated in FIG. 9D by providing the nitrogen high concentration layer 20 before silicide conversion. Consequently, it is possible to easily realize the semiconductor device which has a FinFET which provides a reduced parasitic resistance and a higher current drive.

Consequently, it is possible to prevent the Fin structure 40 of the source/drain area from being completely converted into silicide, so that it is possible not to adopt the elevated source/drain structure which has been conventionally used to avoid this problem, and it is possible to simplify the process. Further, the elevated source/drain structure is not adopted, so that it is possible to realize a reduced parasitic capacitance and a higher speed of the MISFET. Further, the elevated source/drain structure is not adopted, so that the Fin structure 40 of the source/drain area is simplified and, consequently, using a bar type contact plug for a source/drain contact is easy.

Further, according to the same function as the first and second embodiments, it is possible to realize a FinFET of a less threshold voltage variation and a smaller junction leakage. As described above, with an ultrathin FinFET in particular, conversion of a narrow portion of silicon into nickel silicide is accelerated and the narrow portion is abnormally grown, that is, a so-called narrow wire effect becomes a problem. However, according to the present embodiment, it is also possible to suppress an abnormal growth that silicide extends to a channel portion due to a narrow wire effect by controlling silicidation. Consequently, it is possible to control an overlap length Lov.

Further, similar to the first and second embodiments, the manufacturing method of implanting ions before formation of a silicide layer may be adopted instead of implanting ions of source/drain impurities after formation of a silicide layer.

While certain embodiments have been described, these embodiments have been presented by way of example only, and are not intended to limit the scope of the inventions. Indeed, method of manufacturing semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

Although a semiconductor substrate which forms a MISFET has been described using silicon as an example, a germanium (Ge) substrate or silicon germanium ($Si_xGe_{1-x}$ ($0<x<1$) substrate other than silicon may be used.

Further, although a nickel film has been described as an example of a metal film including nickel, a film including platinum (Pt) in nickel or a film including palladium (Pd) in nickel may be used. This is because nickel is included in the metal film, so that the high concentration nitrogen layer can provide an effect of suppressing the growth of the metal semiconductor compound. Further, the metal semiconductor compound layer is also by no means limited to nickel silicide, and may be, for example, nickel platinum silicide or nickel palladium silicide.

Further, although the embodiments have been described using a FinFET of Tri-gate as an example of a 3-dimensional device, the present invention is by no means limited to this structure, and may adopt, for example, a FinFET of Double-gate and Nano-wire MISFET.

In addition, all methods of manufacturing semiconductor devices which have elements of the present invention and which can be adequately designed by one of ordinary skill in the art are incorporated in the scope of the present invention. The scope of the present invention is defined by the scope of claims and the equivalents.

What is claimed is:

1. A method of manufacturing a semiconductor device which comprises a metal insulator semiconductor field effect transistor (MISFET), the method comprising:
   forming a gate insulating film on a semiconductor substrate;
   forming a gate electrode on the gate insulating film;
   implanting nitrogen ions equal to or more than $5.0e14\ cm^{-2}$ and equal to or less than $1.5e15\ cm^{-2}$ in the semiconductor substrate at both sides of the gate electrode by tilted ion implantation in a direction from an outside to an inside with respect to side surfaces of the gate electrode;
   depositing a metal film including nickel on areas in which nitrogen ions are implanted, the areas being in the semiconductor substrate on both sides of the gate electrode;
   performing a first heat processing of reacting the metal film and the areas and forming metal semiconductor compound layers;
   removing an unreacted metal film after the first heat processing; and
   performing a second heat processing at a temperature higher than a temperature of the first heat processing,
   wherein the temperature of the first heat processing is 275° C. or more and 350° C. or less, and the metal semiconductor compound layers after the second heat processing are NiSi (nickel silicide) phase, and facet surfaces are formed in boundaries between a channel area and the metal semiconductor compound layers.

2. The method according to claim 1, wherein shapes of the metal semiconductor compound layers are controlled by the nitrogen profiles of the areas.

3. The method according to claim 1, wherein a tilting angle of the tilted ion implantation is 15° or more and 75° or less.

4. The method according to claim 1, wherein the semiconductor substrate is silicon.

5. The method according to claim 1, wherein the gate insulating film is formed on (100) plane of the semiconductor substrate.

6. The method according to claim 5, wherein the temperature of the second heat processing is 400° C. or more and 450° C. or less.

7. The method according to claim 1, wherein the temperature of the second heat processing is 400° C. or more and 450° C. or less.

8. A method of manufacturing a semiconductor device which comprises a metal insulator semiconductor field effect transistor (MISFET), the method comprising:
    forming a gate insulating film on a SOI (Silicon On Insulator) substrate;
    forming a gate electrode on the gate insulating film;
    implanting nitrogen ions equal to or more than $5.0e14\,cm^{-2}$ and equal to or less than $1.5e15\,cm^{-2}$ in the SOI substrate at both sides of the gate electrode by tilted ion implantation in a direction from an outside to an inside with respect to side surfaces of the gate electrode;
    depositing a metal film including nickel on areas in which nitrogen ions are implanted, the areas are in the SOI substrate on both sides of the gate electrode; and
    performing a first heat processing of reacting the metal film and the areas and forming metal semiconductor compound layers;
    removing an unreacted metal film after the first heat processing; and
    performing a second heat processing at a temperature higher than a temperature of the first heat processing,
    wherein the temperature of the first heat processing is 275° C. or more and 350° C. or less, and the metal semiconductor compound layers after the second heat processing are NiSi (nickel silicide) phase, and facet surfaces are formed in boundaries between a channel area and the metal semiconductor compound layers.

9. The method according to claim 8, wherein shapes of the metal semiconductor compound layers are controlled by the nitrogen profiles of the areas such that the metal semiconductor compound layers do not contact an upper surface of a BOX (buried oxide) layer of the SOI substrate.

10. The method according to claim 8, wherein a tilting angle of the tilted ion implantation is 15° or more and 75° or less.

11. The method according to claim 8, wherein the gate insulating film is formed on (100) plane of the SOI substrate.

12. The method according to claim 11, wherein the temperature of the second heat processing is 400° C. or more and 450° C. or less.

13. The method according to claim 8, wherein the temperature of the second heat processing is 400° C. or more and 450° C. or less.

* * * * *